(12) United States Patent
Nguyen et al.

(10) Patent No.: US 6,538,469 B1
(45) Date of Patent: Mar. 25, 2003

(54) TECHNIQUE TO TEST AN INTEGRATED CIRCUIT USING FEWER PINS

(75) Inventors: Khai Nguyen, San Jose; Chiakang Sung, Milpitas; Bonnie Wang, Cupertino; Joseph Huang, San Jose; Xiaobao Wang, Santa Clara, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/630,071

(22) Filed: Jul. 31, 2000

Related U.S. Application Data

(62) Division of application No. 09/094,221, filed on Jun. 9, 1998
(60) Provisional application No. 60/049,275, filed on Jun. 10, 1997, provisional application No. 60/049,478, filed on Jun. 13, 1997, provisional application No. 60/049,246, filed on Jun. 10, 1997, provisional application No. 60/052,990, filed on Jun. 10, 1997, provisional application No. 60/049,247, filed on Jun. 10, 1997, provisional application No. 60/049,243, filed on Jun. 10, 1997, provisional application No. 60/050,953, filed on Jun. 13, 1997, and provisional application No. 60/049,245, filed on Jun. 10, 1997.

(51) Int. Cl.⁷ .............................. H03K 19/177
(52) U.S. Cl. .................. 326/40; 326/16; 326/39; 714/724; 714/725
(58) Field of Search ............................ 326/38–41, 46, 326/47, 16; 365/201, 230.06; 714/724, 725, 744

(56) References Cited

U.S. PATENT DOCUMENTS

| | | |
|---|---|---|
| 3,761,695 A | 9/1973 | Eichelberger |
| 3,783,254 A | 1/1974 | Eichelberger |
| 3,806,891 A | 4/1974 | Eichelberger et al. |
| 4,267,463 A | 5/1981 | Mayumi |
| 4,488,246 A | 12/1984 | Brice |
| 4,488,259 A | 12/1984 | Mercy |
| 4,512,011 A | 4/1985 | Turner |
| 4,584,673 A | 4/1986 | Kuljk |
| 4,667,325 A | 5/1987 | Kitano et al. |

(List continued on next page.)

FOREIGN PATENT DOCUMENTS

WO    WO 97/06599    2/1997

OTHER PUBLICATIONS

IEEE Standard 1149. 1b–1994, Test Access Port And Boundary–Scan Architecture, p. 59.*
Altera Corporation, Data Sheet, "Flex 10K Embedded Programmable Logic Family," Jul., 1995, ver. 1, pp. 1–39.
Altera Corporation, Data Sheet, "Flex 8000 Programmable Logic Device Family," Aug., 1994, ver. 4, pp. 1–22.
Altera Corporation, Data Sheet, "Max 7000 Programmable Logic Device Family," Jun. 1996, ver. 4, pp. 191–259.
Altera Corporation, Application Note 39, "JTAG Boundary–Scan Testing In Altera Devices," Nov., 1995, ver. 3, pp. 1–28.

(List continued on next page.)

*Primary Examiner*—Michael Tokar
*Assistant Examiner*—Vibol Tan
(74) *Attorney, Agent, or Firm*—Townsend and Townsend and Crew LLP

(57) ABSTRACT

A technique to implement functions requiring fewer pins of an integrated circuit to serially transfer data into the integrated circuit for multiple logic blocks. By reducing the required pins, this permits downbonding of the integrated circuit into a package with fewer pins. This technique may be used to implement test Functions in a programmable logic device. Test data may be serially input using a test pin (410) for two or more columns (320) of logic blocks. The test data is stored in an A resister (330), and may be later transferred into a B register (335).

35 Claims, 6 Drawing Sheets

U.S. PATENT DOCUMENTS

| | | | |
|---|---|---|---|
| 4,701,920 A | | 10/1987 | Resnick et al. |
| 4,857,774 A | * | 8/1989 | El-Ayat et al. ............... 307/465 |
| 5,175,859 A | | 12/1992 | Miller et al. |
| 5,336,951 A | | 8/1994 | Josephson et al. |
| 5,355,369 A | | 10/1994 | Greenberger et al. |
| 5,361,373 A | | 11/1994 | Gilson |
| 5,381,420 A | | 1/1995 | Henry |
| 5,412,260 A | | 5/1995 | Tsui et al. |
| 5,489,858 A | | 2/1996 | Pierce et al. |
| 5,491,666 A | | 2/1996 | Sturges |
| 5,519,715 A | | 5/1996 | Hao et al. |
| 5,550,843 A | * | 8/1996 | Yee ........................... 371/22.3 |
| 5,581,564 A | | 12/1996 | Miller et al. |
| 5,590,305 A | | 12/1996 | Terril et al. |
| 5,594,367 A | | 1/1997 | Trimberger et al. |
| 5,627,842 A | * | 5/1997 | Brown et al. ............... 371/22.3 |
| 5,644,496 A | | 7/1997 | Agrawal et al. |
| 5,650,734 A | | 7/1997 | Chu et al. |
| 5,712,858 A | | 1/1998 | Godiwala et al. |
| 5,717,702 A | | 2/1998 | Stokes et al. |
| 5,734,868 A | | 3/1998 | Curd et al. |
| 5,737,567 A | | 4/1998 | Whittaker et al. |
| 5,841,867 A | | 11/1998 | Jacobson et al. |
| 5,864,486 A | | 1/1999 | Deming et al. |
| 5,869,979 A | | 2/1999 | Bocchino |
| 5,909,450 A | | 6/1999 | Wright |
| 5,909,453 A | * | 6/1999 | Kelem et al. ............ 371/22.32 |
| 5,936,973 A | | 8/1999 | Lovett et al. |
| 5,949,797 A | | 9/1999 | Jung |
| 5,982,683 A | * | 11/1999 | Watson et al. ............... 365/201 |
| 5,987,621 A | | 11/1999 | Duso et al. |
| 5,996,097 A | * | 11/1999 | Evans et al. ................. 714/719 |
| 6,006,343 A | | 12/1999 | Whetsel |
| 6,041,050 A | | 3/2000 | Sanders |
| 6,041,280 A | | 3/2000 | Kohli et al. |
| 6,157,210 A | * | 12/2000 | Zaveri et al. ................. 326/40 |
| 6,191,608 B1 | | 2/2001 | Cliff et al. |

OTHER PUBLICATIONS

Altera Corporation, "Flex 10K Embedded Programmable Logic Family, " Altera 1996 Data Book, Jun. 1996, ver. 2, pp. 31–90.

Altera Corporation, "Flex 8000 Programmable Logic Device Family," Altera 1996 Data Book, Jun. 1996, ver. 8, pp. 93–153.

IEEE Computer Society, "IEEE Standard Test Access Port and Boundary–Scan Architecture (IEEE Std 1149.1–1990)," Institute of Electrical and Electronics Engineers, Inc., New York, NY, Oct. 21, 1993, pp. 1–1 to 12–6 and Appendix A–1 to A–12.

IEEE Computer Society, "Supplement to (IEEE Std 1149.1–1990), IEEE Standard Test Access Port and Boundary–Scan Architecture (IEEE Std 1149.1b–1994)," Institute of Electrical and Electronics Engineers, Inc., New York, NY, Mar. 1, 1995, pp. 1–67.

Xilnix Corporation, "The Programmable Logic Data Book," 1993, pp. 1–1 to 10–8.

Xilnix Corporation, "The Programmable Logic Data Book," Section 9, 1994, pp. 9–1 to 9–32.

Xilnix Corporation, "The Programmable Logic Data Book," Product Description, "XC2000 Logic Cell Array Families," Aug. 1994, pp. 2–187 to 2–216.

Xilnix Corporation, "The Programmable Logic Data Book," Product Description, "XC3000, XC3000A, XC000L, SC3100, XC3100A Logic Cell Array Families," pp. 2–105 to 2–125. (No date).

Xilnix Corporation, "The Programmable Logic Data Book," Product Specification, "XC4000 Series Field Programmable Gate Arrays," Jul. 30, 1996, version 1.03, pp. 4–5 to 4–76.

* cited by examiner

TECHNIQUE TO TEST AN INTEGRATED CIRCUIT USING FEWER PINS

This is a divisional application of U.S. patent application Ser. No. 09/094,221, filed Jun. 9, 1998, which claims the benefit of U.S. provisional applications, No. 60/049,275, filed Jun. 10, 1997; No. 60/049,478, filed Jun. 13, 1997; No. 60/049,246, filed Jun. 10, 1997; No. 60/052,990, filed Jun. 10, 1997; No. 60/049,247, filed Jun. 10, 1997; No. 60/049,243, filed Jun. 10, 1997; No. 60/050,953, filed Jun. 13, 1997; and No. 60/049,245, filed Jun. 10, 1997, all of which are incorporated by reference.

BACKGROUND OF THE INVENTION

The present invention relates to the field of integrated circuits, and more specifically to techniques to reduce the utilization of external pins in implementing integrated circuit functionality.

Semiconductor technology continues to improve. This technology allows greater and greater functionality to be provided by a single integrated circuit or "chip". Signals are input to and output from the chips using external pins or pads. The chip interfaces to external circuitry, possibly on other chips, using the external pins.

Many functions such as testing and configuration of an integrated circuit are performed using the external pins. An integrated circuit may be packaged in a package having a sufficient number external pins to bond to all the pads of the integrated circuit. However, it is also desirable that the same integrated circuit may be packaged or "downbonded" into a smaller package with fewer external pins. Smaller packages may be desirable because of their reduced cost. For example, it is desirable to use a package size that provides a sufficient number of I/Os. And, a larger package size is not used because the additional I/Os would be left unused.

It is important that functions such as testing and configuration remain accessible even when the integrated circuit is downbonded into a smaller package. Consequently, there is a need for techniques of implementing functions in integrated circuits to facilitate downbonding of the integrated circuit into a package with fewer pins.

SUMMARY OF THE INVENTION

The present invention is a technique of implementing functionality on an integrated circuit to facilitate downbonding of the integrated circuit into packages with fewer pins. Furthermore, in a specific embodiment, the present invention is a technique to reduce the number of required test pins, especially for low-pin count packages. Downbonding is desirable since it provides the customer with a wide range of package choices and the option to get a low-pin count package of the same device for much lower price.

As a specific example, in a programmable integrated circuit such as a programmable logic device (PLD), test data may be serially input using a single test pin into the integrated circuit in serial for two (or more) columns of logic array blocks, instead of one column. Many columns may be input in parallel using a plurality of test pins.

Test data is input using the test pin, and is stored in a first register. This test data is then transferred in parallel to a second register. From the second register, the test data may be transferred to the logic array blocks for testing of the logic array blocks. The technique of the present invention will provide the same full test coverage of the device. With fewer number of test pins, the device can be downbonded to the smaller pin count packages.

Other objects, features, and advantages of the present invention will become apparent upon consideration of the following detailed description and the accompanying drawings, in which like reference designations represent like features throughout the figures.

DESCRIPTION OF THE SPECIFIC EMBODIMENTS

Figure 1:
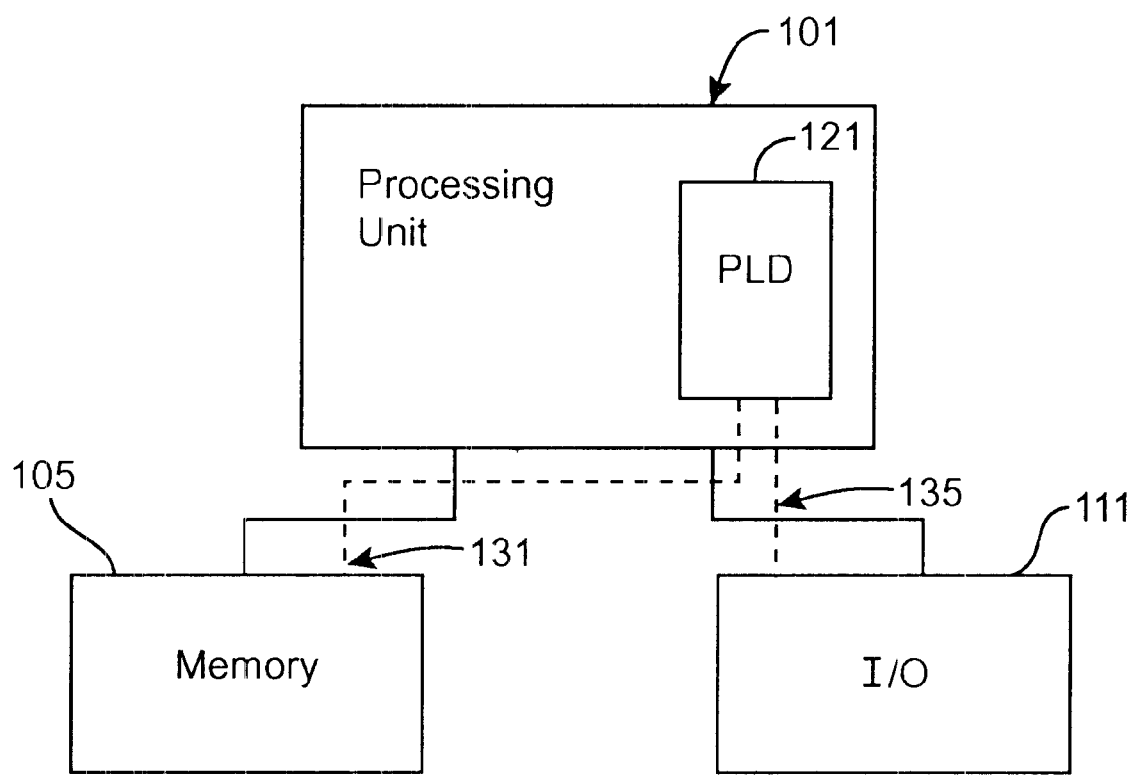
FIG. 1 shows a digital system incorporating a programmable logic device.

FIG. 1 shows a block diagram of a digital system. The system may be provided on a single board, on multiple boards, or even within multiple enclosures linked by electrical conductors or a network (e.g., a local area network or the internet). This digital system may be used in a wide variety of applications and industries including networking, telecommunications, automotives, control system, consumer electronic, computers, Workstations, military, industrial, digital processing, and many others. In the embodiment of FIG. 1, a processing unit 101 is coupled to a memory 105 and an I/O 111. Further, a programmable logic device (PLD) 121 is incorporated within this digital system. PLD 121 may be specially coupled to memory 105 through connection 131 and to I/O 111 through connection 135.

Programmable logic devices (PLDs) are sometimes also referred to as PALs, PLAs, FPLAs, CPLDs, EPLDs, EEPLDs, LCAs, or FPGAs. PLDs are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® and FLEX® series of devices. The former are described in, for example, U.S. Pat. Nos. 5,241,224 and 4,871,930, and the Altera Data Book, June 1996, all incorporated herein by reference in their entirety for all purposes. The latter are described in, for example, U.S. Pat. Nos. 5,258,668, 5,260,610, 5,260,611, and 5,436,575, and the Altera Data Book, June 1996, all incorporated herein by reference in their entirety for all purposes.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, prgrammable logic device programmed for use as a controller, or other processing unit. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block processing unit 101, supporting its internal and external operations. PLD 121 is programmed or configured to implement the logical functions necessary to carry on its particular role in system operation.

Figure 2:
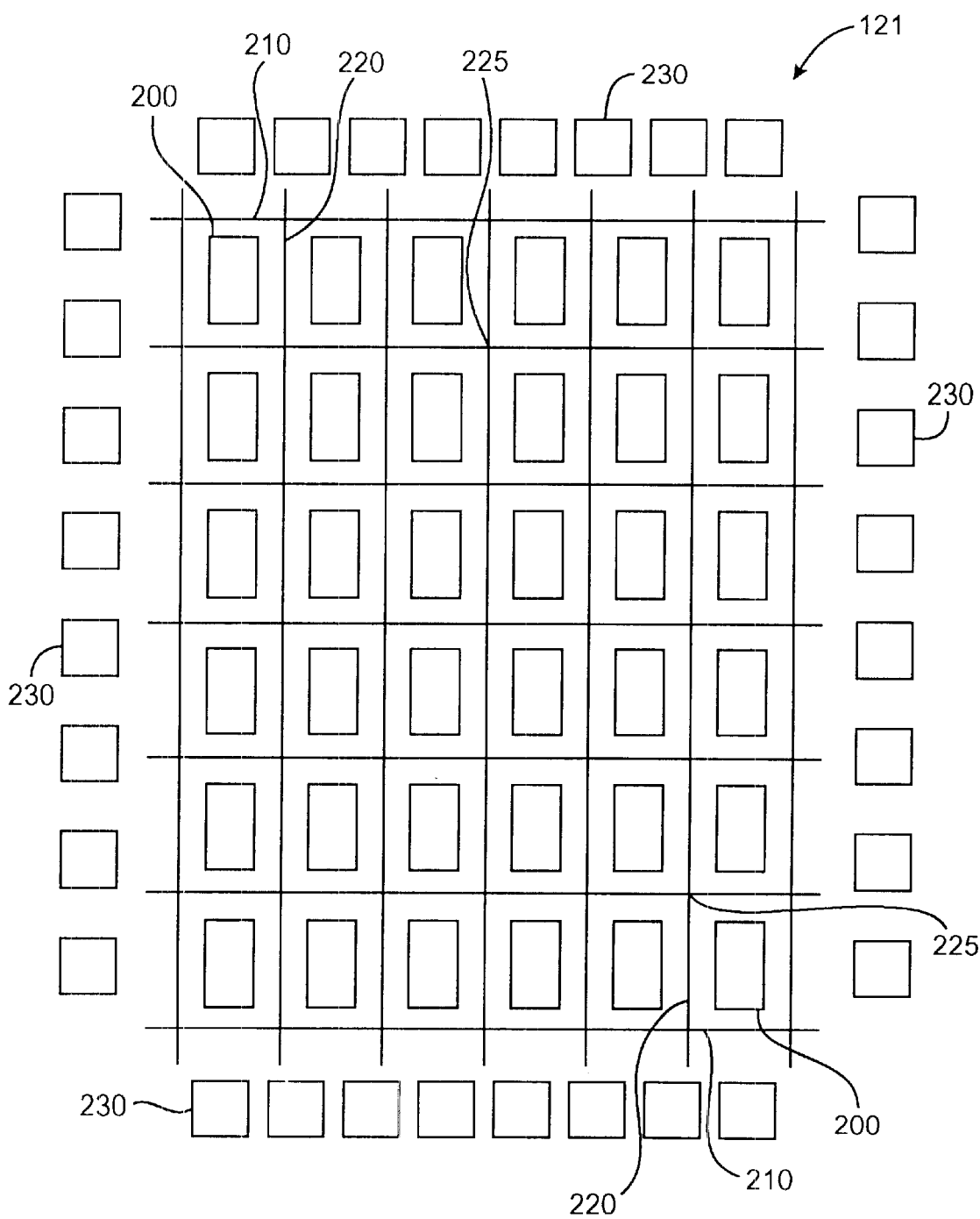
FIG. 2 shows an block diagram of a programmable logic device.

FIG. 2 shows a simplified block diagram of the overall internal architecture and organization of a programmable logic device integrated circuit, such as PLD 121 of FIG. 1. Many details of PLD architecture, organization, and circuit design are not necessary for an understanding of the present invention and such details are not shown in FIG. 2. Further details of a specific architecture such as shown in FIG. 2 is discussed in Altera Corp., "FLEX® 8000, " in 1996 *Data Book*, June 1996 and Altera Corp., "FLEX®10K," in 1996 *Data Book*, June 1996.

To briefly describe a PLD architecture, FIG. 2 shows a six-by-six two-dimensional array of thirty-six logic array blocks (LABs) 200. A PLD may have any number of LABs, and in any arrangement including square and retangular arrays of LABs. LAB 200 is a physically grouped set of logical resources that is configured or programmed to perform logical functions. LAB 200 has inputs and outputs (not shown) which may or may not be programmably connected to a global interconnect structure.

The global interconnect structure includes an array of global horizontal interconnects (GHs) 210 and global vertical interconnects (GVs) 220. Although shown as single lines in FIG. 2, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200. FIG. 2 further shows at the peripheries of the chip, input-output drivers 230. Input-output drivers 230 are for interfacing the PLD to external, off-chip circuitry.

It is common for programmable integrated circuits, especially high-density PLDs (such as Altera's FLEX® 8000 and FLEX® 10K), to have many different package types for the same device. For example, a particular PLD integrated circuit may be packaged in different package sizes such as a 160-pin package, 144-pin package, 100-pin package, 84-pin package, or package with other number of pins. An Integrated circuit may be fabricated with 160 pads. When packaged in a 160-pin package, the 160 pads will be bonded to the 160 external pins of the package. However, when packaged in a 144-pin package, only a selected 144 pads (of the 160) will be bonded to the external pins. The packaging of an integrated circuit into a smaller package is referred to as "downbonding."

An advantage of a larger package size is there will be more pins available for input and output of data, which generally results in hither performance. However, a larger package is more costly since the package cost will be greater, and also the larger package will take up more area on a printed circuit board (PC board). A larger number of external pins may also require a more expensive multilayered PC board.

To facilitate downbonding, it is important that the integrated circuit be able to provide its functionality in a lower pin count package. For example, a PLD has a function to facilitate testing of the device. Test data is input into the device to test the logic on the integrated circuit. The test functionality may be used to ensure the programmable integrated circuit is working properly after it has been configured.

Figure 3:
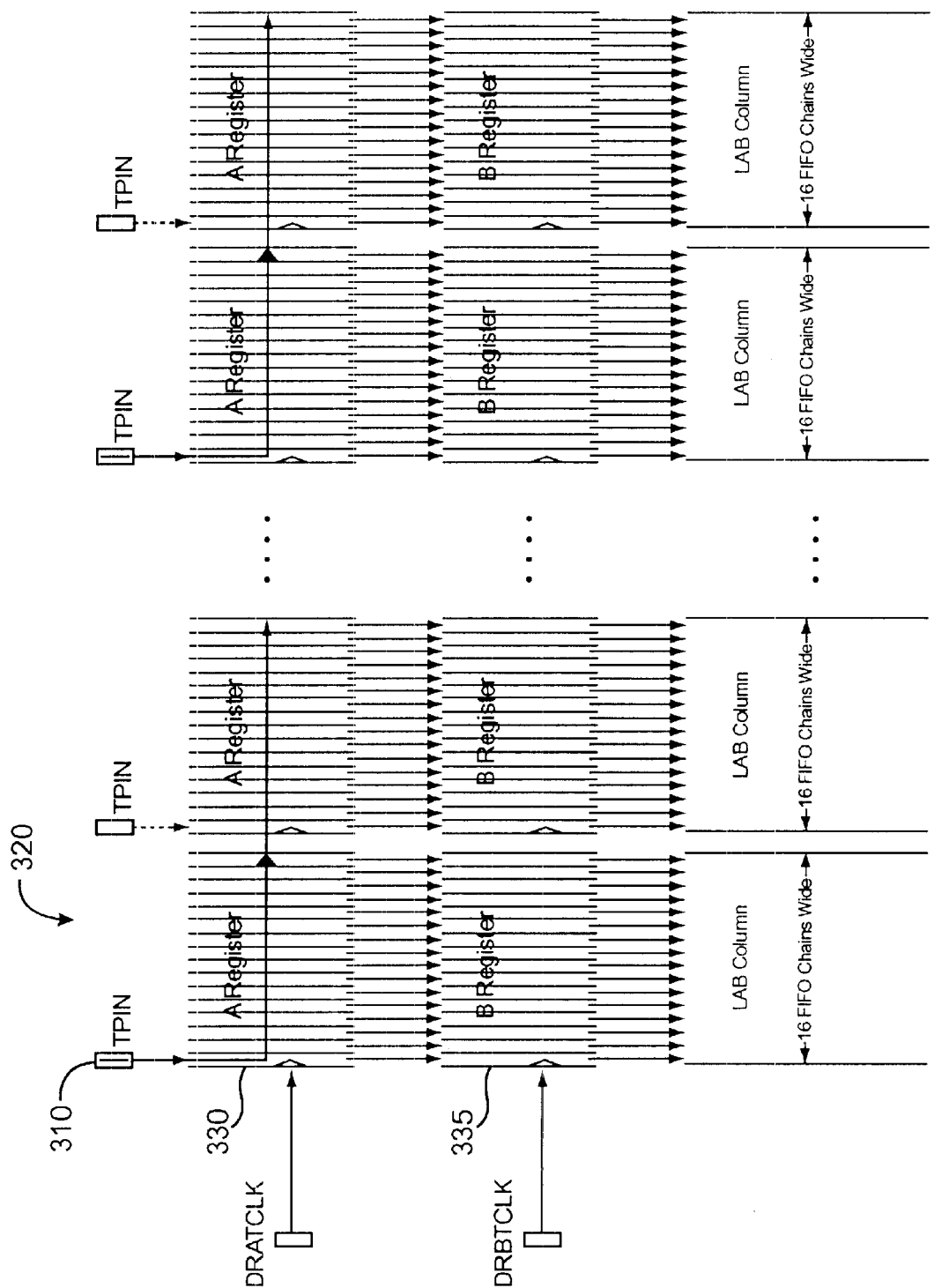
FIG. 3 shows a technique for testing a programmable integrated circuit.

FIG. 3 illustrates a technique for testing an integrated circuit. There is a test pin 310 (TPIN) associated with each LAB column 320. Each LAB column has an A resister 330 and a B register 335. In a specific embodiment, the A register and B register have 16 bits or storage elements per column. In other embodiments, the register may have any number of bits, such as 8, 24, or 32. A latch or D flip-flop may be used to implement each element in the registers. The elements implementing the A register are arranged in a serial chain much like a large shift register.

In operation, TPIN is used to serially input data into the A register. A DRATCLK clock input is used to clock data into the A register. For example, 16 bits of data may be serially input at TPIN for its respective LAB column using 16 clock pulses at DRATCLK. After a frame of 16 bits of test data has been loaded into the A register, a DRBTCLK clock input is used to clock these 16 bits of data in parallel into the B register. And, the test data may be transferred in parallel to 16 FIFO chains in the core of a LAB column, where the test data will be utilized.

The configuration shown in FIG. 3, however, may not be workable if a particular integrated circuit were downbonded to a smaller package because there will be fewer pins available to be test pins (TPINs). For example, if a test pin is omitted, it will not be possible to test the particular LAB column associated with that test pin. A technique to permit full-coverage testing functionality and also facilitate downbonding is shown in FIG. 4.

Figure 4:
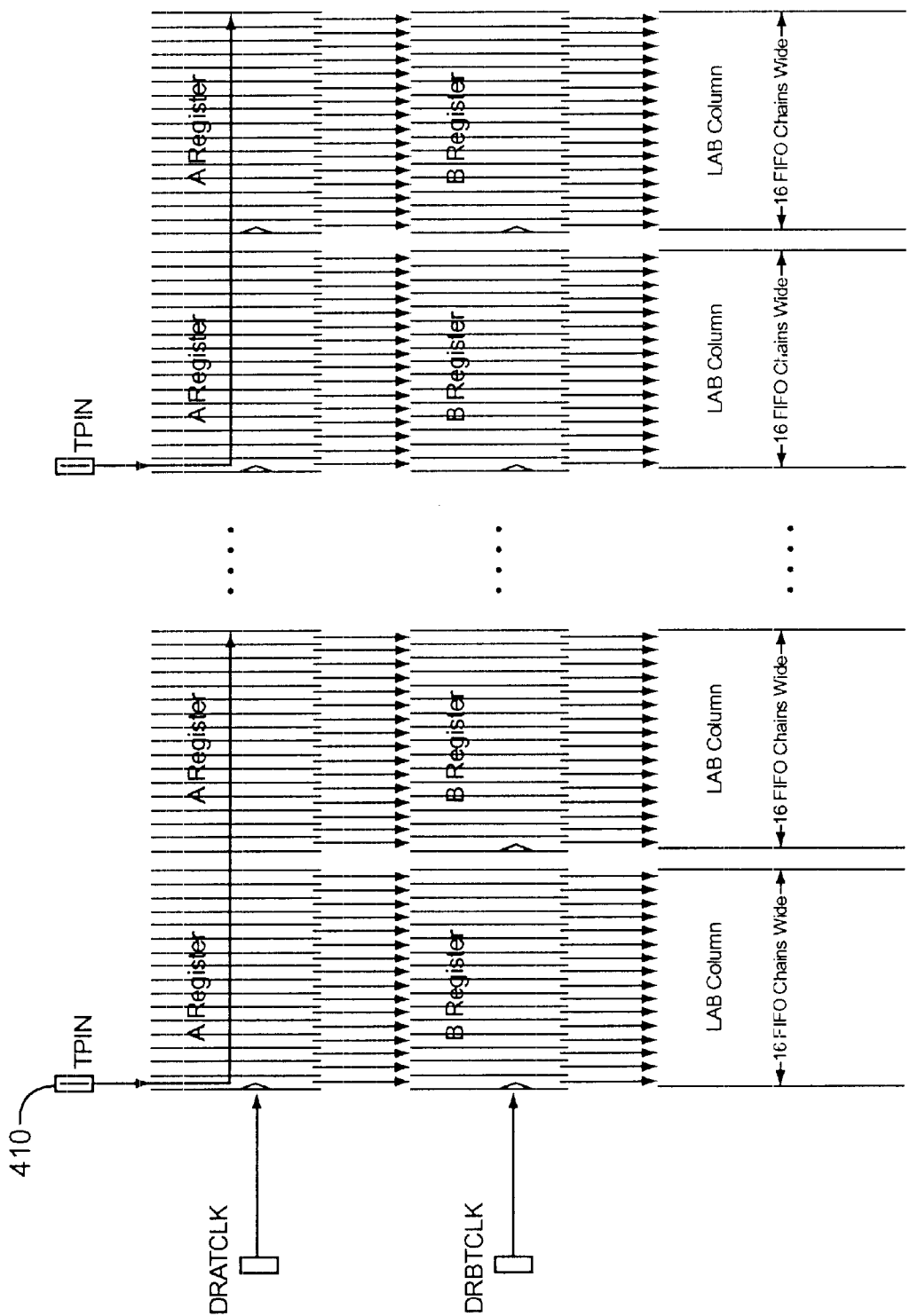
FIG. 4 shows a technique for testing the programmable integrated circuit using fewer pins.

FIG. 4 shows an approach where a test pin 410 (TPIN) is shared between two LAB columns. Compared to the approach in FIG. 3, only half as many test pins 410 are required. This approach may be similarly extended so that a TPIN is associated with any number of multiple columns. For example, TPIN 410 will be used to input test data for two LAB columns (as in FIG. 4), or three columns, four columns, five columns, or even greater numbers of columns. By sharing a single TPIN with multiple columns of LABs, fewer external pins are required to perform the test function.

In operation, for FIG. 4, test data is serially loaded into the A register using TPIN 410 and clock pin DRATCLK. Two columns of test data are entered using 32 clock cycles (as compared to the 16 clock cycles for FIG. 3). It may take a slightly longer period of time to input or program a test pattern into the data register, but overall, this technique will still provide the same full test coverage and functionality of the device. Once a frame of data (e.g., in FIG. 4, 32 bits of data) is loaded into the A register, the data is then loaded in parallel into the B register, and then transferred to the FIFO chains in the core. The LAB core will be tested using the test data.

As can be appreciated, because fewer test in are required, the programmable integrated circuit may be downbonded to the smaller win count packages, and still allow the same full coverage test capability.

Figure 5:
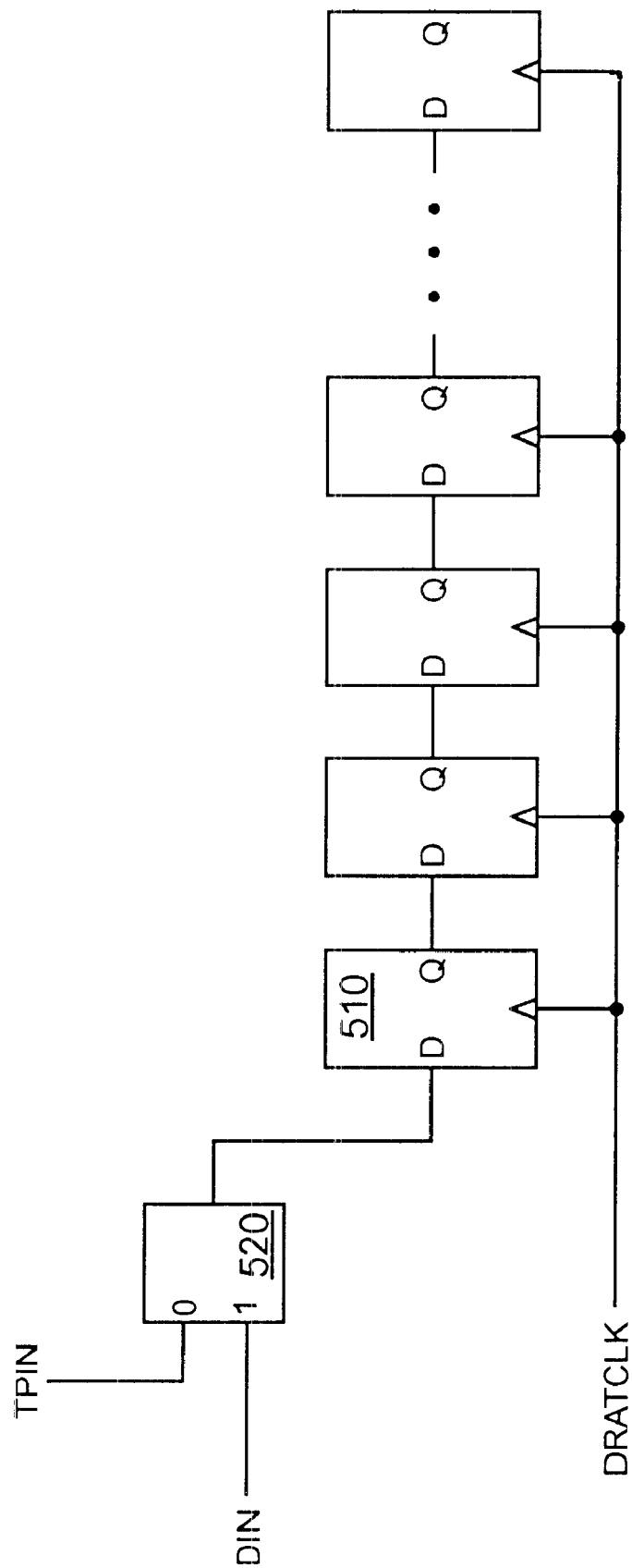
FIG. 5 shows circuitry to implement a register for testing of the programmable integrated circuit.

FIG. 5 shows a circuit implementation for a register such as the A register 330 for testing. These registers are arranged in a serial chain, where each flip-flop 510 stores a single bit of test data. TPIN may be selected to input a first flip-flop 510 in the serial chain through a multiplexer 520. Input of the first flip-flop 510 may also come from a DIN input, which may be an internal (to the chip) of external test data source. Test data is clocked in serially using the DRATCLK clock input. There may be any number of flip-flops 510 arranged as shown in FIG. 5. For example, for the embodiment of FIG. 4, there would be a sufficient number of number of flip-flops 510 for two columns (e.g., 32) of logic blocks.

Figure 6:
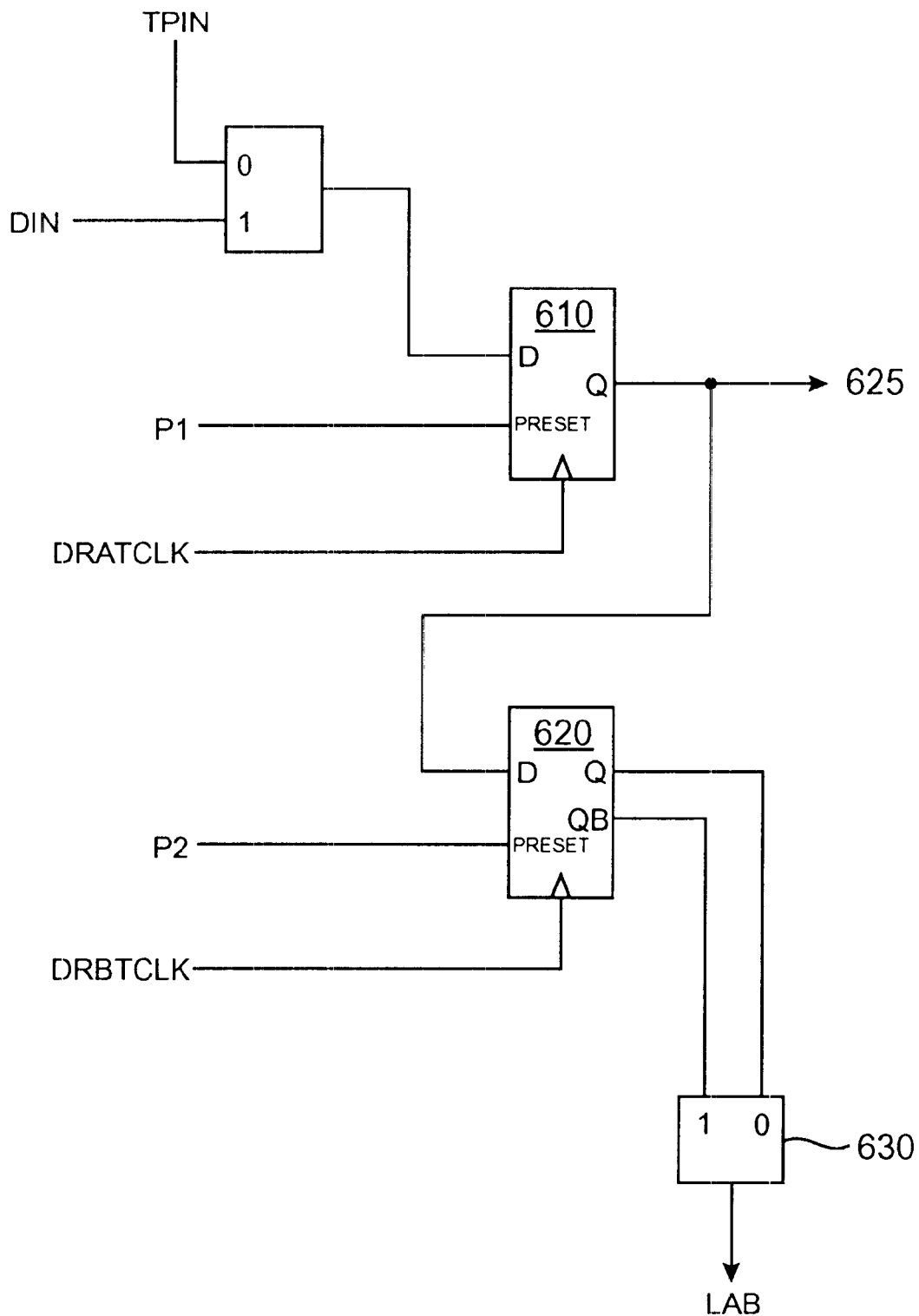
FIG. 6 shows circuitry to implement two levels of registers for testing.

FIG. 6 shows how a single flip-flop in the A register 330 is coupled to a single flip-flop the B register 335. This diagram is like a "bit slice" of the A and B registers. The A and B registers may be made of any arbitrary size by extending the number of flip-flops in parallel.

In FIG. 6, a flip-flop 610 is for the A register, and a flip-flop 620 is for the B register. An output 625 of flip-flop 610 is coupled to an input of flip-flop 620. This output of flip-flop 610 is also coupled to the next flip-flop in the serial chain for the A register (see FIG. 5). There is a Q and QB output for flip-flop 625. Either of these outputs may be input to the LAB, and is selected using a multiplexer 630. Flip-flop 620 may be preset using a P1 input, and flip-flop 620 may be preset using a P2 input. The flip-flops may be preset upon power-up of the integrated circuit to ensure to the flip-flops are in a known state. Other features in FIG. 6 are similar to features discussed with regard to other figures.

The foregoing description of preferred embodiments of the invention as been presented for the purposes of illustration and description. It is not intended to be exhaustive or to limit to the invention to the precise form described, and many modifications and variations are possible in light of the caching above. The embodiments were chosen and described in order to best explain the principles of the invention and its practical applications to thereby enable others skilled in the art to best utilize and practice the invention in various embodiments and with various modifications as are suited to the particular use contemplated. It is intended that the scope of the invention be defined by the following claims.

What is claimed is:

1. A programmable logic circuit comprising:
   an array of logic blocks arranged in rows and columns;
   an interconnect structure comprising first conductors between columns of the logic blocks and second conductors between rows of the logic blocks;
   a plurality of test pins to interface with signals external to the programmable circuit, wherein each of the test pins provides test data to at least two columns of logic blocks;
   a first register for two columns of logic blocks, wherein test data is loaded into the first register via one test pin; and
   a second register for two columns of logic blocks, wherein test data stored in the first register is loaded into the second register in parallel.

2. A programmable logic circuit comprising:
   an array of logic blocks arranged in rows and columns;
   an interconnect structure comprising first conductors between columns of the logic blocks and second conductors between rows of the logic blocks;
   a plurality of test pins to interface with signals external to the programmable circuit, wherein each of the test pins provides test data to at least two columns of logic blocks;
   a fist multiplexer coupled to selectively pass a first signal from a test pin or a second signal to a first multiplexer output;
   a first flip-flop, coupled to the first multiplexer output;
   a second flip-flop, coupled to a first flip-flop output; and
   a second multiplexer, coupled to a second flip-flop output, a second multiplexer output coupled to a logic block.

3. The programmable logic circuit of claim 2 wherein the first flip-flop is further coupled to a first clock line and the second flip-flop is further coupled to a second clock line.

4. The programmable logic circuit of claim 2 wherein the second multiplexer is further coupled to a second flip-flop inverted output.

5. A programmable logic circuit comprising:
   a plurality of logic array blocks arranged in rows and columns;
   an interconnect structure comprising a first plurality of conductors between columns of the logic array blocks and a second plurality of conductors between the rows of the logic array blocks;
   a plurality of test pins;
   a first plurality of registers, each selectively coupled to one of the plurality of test pins; and
   a second plurality of registers, each coupled between one of the first plurality of registers and a column of logic array blocks.

6. The programmable logic circuit of claim 5 wherein each of the first plurality of registers comprises a first clock line, and test data is serially shifted from the plurality of test pins to the first plurality of registers under control of a first clock signal on the first clock line.

7. The programmable logic circuit of claim 6 wherein each of the second plurality of registers comprises a second clock line, and test data is transferred in parallel from the first plurality of registers to the second plurality of registers under control of a second clock signal on the second clock line.

8. The programmable logic circuit of claim 7 wherein each of the first plurality of registers comprises:
   a plurality of flip-flops arranged in a serial chain, a first flip-flop in the serial chain selectively coupled to one of the plurality of test pins.

9. A programmable logic circuit comprising:
   a plurality of logic array blocks arranged in rows and columns;
   an interconnect structure comprising a first plurality of conductors between columns of the logic array blocks and a second plurality of conductors between the rows of the logic array blocks;
   a test pin;
   a first register selectively coupled to the test pin; and
   a second register coupled between the first register and at least two columns of logic array blocks.

10. The programmable logic device of claim 9 wherein the first register comprises a chain of flip-flops, each having an input, an output, and a clock input.

11. The programmable logic device of claim 10 wherein the clock input of each of the flip-flops in the first register couple to a first clock line, and test data is shifted from the test pin into the first register under control of a first clock signal on the first clock line.

12. The programmable logic device of claim 11 wherein the second register comprises a plurality of flip-flops, each having an input, an output, and a clock input, each input of a flip-flop in the second register couples to an output of a flip-flop in the first register, and each output of a flip-flop in the second register couples to a column of logic array blocks.

13. The programmable logic device of claim 12 wherein the clock input of each of the flip-flops in the second register couple to a second clock line, and test data is transferred in parallel from the first register to the second register under control of a second clock signal on the second clock line.

14. The programmable logic circuit of claim 13 wherein the first register comprises at least 32 flip-flops.

15. The programmable logic circuit of claim 9 wherein a first flip-flop in the first register is coupled to a second flip-flop in the first register and a first flip-flop in the second register.

16. The programmable logic circuit of claim 15 further comprising:
   a multiplexer having a first input, a second input, and an output, wherein the first input is coupled to an output of the first flip-flop in the second register and the second input is coupled to an inverting output of the first flip-flop in the second register.

17. The programmable logic circuit of claim 15 further comprising:
   a multiplexer having a first input, a second input, and an output, wherein the first input is coupled to the test pin and the output is coupled to the first flip-flop in the first register.

18. A programmable logic circuit comprising:
   a plurality of logic array blocks arranged in rows and columns;
   an interconnect structure comprising a first plurality of conductors between columns of the logic array blocks and a second plurality of conductors between the rows of the logic array blocks;
   a test pin;
   a first flip-flop having an input coupled to the test pin, a clock input, and an output;
   a second flip-flop having an input coupled to the output of the first flip-flop, a clock input, and an output;
   a third flip-flop having an input coupled to the output of the first flip-flop, a clock input, and an output coupled to a column of logic array blocks; and
   a fourth flip-flop having an input coupled to the output of the second flip-flop, a clock input, and an output coupled to the column of logic array blocks.

19. The programmable logic circuit of claim 18 wherein the clock input of the first register and the clock input of the second register couple to a first clock line.

20. The programmable logic circuit of claim 19 wherein the clock input of the third register and the clock input of the fourth register couple to a second clock line.

21. A programmable logic circuit comprising:
   a plurality of logic array blocks arranged in rows and columns;
   an interconnect structure comprising a first plurality of conductors between columns of the logic array blocks and a second plurality of conductors between the rows of the logic array blocks;
   a test pin;
   a shift register having an input coupled to the test pin; and
   a parallel register having inputs coupled to outputs of the shift register, and outputs coupled to at least one column of logic array blocks.

22. The programmable logic circuit of claim 21 wherein the shift register comprises a chain of flip-flops, and a first flip-flop in the chain is coupled to the test pin.

23. The programmable logic circuit of claim 22 wherein the parallel register comprises a plurality of flip-flops, each having an input coupled to an output of a flip-flop in the first register, and an output coupled to a column of logic array blocks.

24. An integrated circuit comprising:
   an array of logic blocks arranged in rows and columns;
   a plurality of test pins, wherein each of the test pins receives test data for at least one column of logic blocks;
   a fist register, wherein test data is loaded into the first register serially via a test pin; and
   a second register, wherein test data stored in the first register is loaded into the second register in parallel.

25. The integrated circuit of claim 21 wherein each of the test pins receives test data to at least two columns of logic blocks.

26. The integrated circuit of claim 21 wherein the second register is coupled to a plurality of First-In First-Out (FIFO) chains.

27. The integrate circuit of claim 21 wherein test data is loaded into the first register under control of a first clock signal on a first clock line, and data is transferred in parallel to the second register under control of a second clock signal on a second clock line.

28. An integrated circuit comprising:
   an array of logic blocks arranged in rows and columns;
   an interconnect structure comprising fist conductors between columns of the logic blocks and second conductors between rows of the logic blocks;
   a plurality of test pins, wherein each of the test pills receives test data for a plurality of columns of logic blocks;
   a first register comprising a series of flop-flops, a first flip-flop selectively coupled one of the plurality of test pins, wherein test data is loaded into the first register serially via a test pin under control of a first clock signal on a first clock line; and
   a second register comprising a plurality of flip-flops, each of the plurality of flip-flops coupled to one of the series of flip-flops in the first register, the second register coupled to a plurality of columns of logic blocks, wherein test data stored in the first register is loaded into the second register in parallel under control of a second clock signal on a second clock line.

29. The integrated circuit of claim 28 wherein each of the plurality of flip-flops in the second register is coupled to a FIFO chain in the plurality of column of logic block.

30. The programmable logic circuit of claim 2 wherein the first flip-flop is in a first register and the second flip-flop is in a second register.

31. The programmable logic circuit of claim 5 wherein each of the second plurality of registers flier couple to another column of logic array blocks.

32. The programmable logic circuit of claim 8 wherein each of the second plurality of registers comprises:
   a plurality of flip-flips, each flip-flop coupled to a FIFO chain in the column of logic array blocks.

33. The programmable logic circuit of claim 9 wherein the second register is coupled to a plurality of FIFO chains in the columns of logic array blocks.

34. The programmable logic circuit of claim 15 wherein the first flip-flop in the second register is coupled to a FIFO in one of the columns of logic array blocks.

35. The programmable logic circuit of claim 21 wherein the parallel register is firer coupled to a plurality of FIFOs in a column of logic array blocks.

* * * * *